(12) United States Patent
Sato et al.

(10) Patent No.: US 6,893,532 B1
(45) Date of Patent: May 17, 2005

(54) METHOD AND APPARATUS FOR PROCESSING FINE PARTICLE DUST IN PLASMA

(75) Inventors: Noriyoshi Sato, Sendai (JP); Satoru Iizuka, Sendai (JP); Giichiro Uchida, Sendai (JP)

(73) Assignee: Tohoku Techno Arch Co., Ltd. (JP)

( * ) Notice: Subject to any disclaimer, the term of this patent is extended or adjusted under 35 U.S.C. 154(b) by 0 days.

(21) Appl. No.: 10/019,245

(22) PCT Filed: Jun. 29, 1999

(86) PCT No.: PCT/JP99/03501

§ 371 (c)(1),
(2), (4) Date: Dec. 18, 2001

(87) PCT Pub. No.: WO01/01467

PCT Pub. Date: Jan. 4, 2001

(51) Int. Cl.$^7$ ......................................... H01L 21/3065
(52) U.S. Cl. .................................................. 156/345.47
(58) Field of Search ........................ 118/723 E, 723 R; 156/345.43, 345.44, 345.45, 345.46, 345.47, 916

(56) References Cited

U.S. PATENT DOCUMENTS 4,962,727 A * 10/1990 Harada ..................... 118/723 R
5,556,474 A * 9/1996 Otani et al. ............... 118/723 E
5,685,914 A   11/1997 Hills et al. .................... 118/723

FOREIGN PATENT DOCUMENTS

| JP | 59181619 A | * 10/1984 | ......... H01L/21/302 |
| JP | 3-124023 | 5/1991 | |
| JP | 07106307 A | * 4/1995 | ....... H01L/21/3065 |
| JP | 8-102460 | 4/1996 | |
| JP | 09022875 A | * 1/1997 | ......... H01L/21/205 |
| JP | 10-321604 | 12/1998 | |
| JP | 11040398 A | * 2/1999 | ............. H05H/1/46 |
| JP | 11121437 A | * 4/1999 | ....... H01L/21/3065 |

* cited by examiner

Primary Examiner—Gregory Mills
Assistant Examiner—Michelle Crowell
(74) Attorney, Agent, or Firm—Hayes Soloway P.C.

(57) ABSTRACT

An apparatus for processing particulate dust when a substrate is arranged in a high vacuum enclosure, plasma is generated in the high vacuum enclosure, and a reactive material is introduced into the high vacuum enclosure to perform processing of the substrate. At least one collecting electrode is provided around the substrate in the high vacuum enclosure other than the electrode that generates plasma, and particulates generated in plasma are efficiently removed by applying a predetermined electric potential of a direct-current or an alternating current to the collecting electrode, and thus a deposition problem onto an inner wall of the vacuum enclosure and a deterioration problem of processing accuracy and a film quality associated with flowing of the particulates onto the substrate are solved.

7 Claims, 6 Drawing Sheets

TO VACUUM UNIT

FIG. 9

METHOD AND APPARATUS FOR PROCESSING FINE PARTICLE DUST IN PLASMA

This application is a 371 of PCT/JP99/03501 filed Jun. 22, 1999.

BACKGROUND OF THE INVENTION

1. Technical Field

The present invention relates to a technical field in which semiconductor manufacturing, high functional thin film manufacturing and processing are performed using a plasma process. Particularly, the present invention relates to a processing method of particulate dust in plasma generated in a high vacuum enclosure during the plasma process. Further, the processing method includes deliberate control of the particulate dust in plasma.

2. Prior Art

Conventionally, mainly in a field of semiconductor manufacturing, etching processing of a fine pattern on a surface of a substrate such as a silicon wafer and formation of various kinds of functional thin films such as an oxide thin film and a nitride film by surface reforming, plasma chemical deposition or sputtering have been performed extremely accurately by the use of the plasma process.

However, the particulate dust containing clusters generated in the reactive plasma vapor phase has deposited not only on the substrate surface but also on an inner wall surface of the high vacuum enclosure being a reaction enclosure to contaminate the inside of the high vacuum enclosure. Not only the particulates but also particulates flown into plasma due to peeling of a deposition film deposited in this manner are negatively electrified in plasma, electrically trapped by a plasma boundary region on a substrate front surface to flow onto the substrate surface, and thus deteriorating processing accuracy and film quality, which has been a serious problem.

Accordingly, the following methods are used as conventional ones to prevent the particulate dust from mixing into plasma.

(1) Generation of plasma is executed intermittently by pulse discharge to prevent high dissociation of reactive gas and generation of particulate nucleus, and initial particulates are ejected from the vacuum enclosure during a discharge off time to control generation of the particulates in plasma.

(2) The inside of the vacuum enclosure is opened after usage for a predetermined period and the inner wall is entirely cleaned to remove deposit.

(3) The wall surface of the vacuum enclosure is heated to a high temperature (a few hundred degrees ° C.) to control deposition onto the wall surface within a certain level.

(4) The substrate is arranged to face downward or sideward to prevent the particulates from falling onto the substrate, and the number of mobile portions is made as small as possible to prevent generation of the particulates due to peeling.

(5) A groove is formed beside a substrate holder to confine the particulates and the particulates are ejected along the groove by gas flow.

Sufficient effect could not be obtained by the above methods. For example: in method (1), control needs to be executed where plasma is generated intermittently and a processing time in the plasma process lengthens to reduce productivity; in method (2), processing itself needs to be discontinued periodically, by which not only productivity is reduced but also a large amount of cost is required for the cleaning; in method (3), not only much energy is required to heat the wall surface of the vacuum enclosure to the high temperature (a few hundred ° C.), but also peeling from the wall surface is only reduced and the particulate dust generated in plasma cannot be removed; in method (4), although influence of the particulates generated in plasma can be reduced, the problem of peeling from the inner wall of the vacuum enclosure cannot be solved; and in method (5), although both the particulate dust generated in plasma and deposition of the particulate dust onto the wall surface can be prevented, the particulate dust generated cannot be collected and ejected efficiently due to high vacuum of the inside of the vacuum enclosure.

Therefore, the present invention has been created paying attention to the foregoing problems, and its object is to provide a removing method of the particulate dust in plasma and an apparatus thereof, in which the particulate dust generated in plasma is removed efficiently to solve a problem of deposition onto the inner wall of the vacuum enclosure and a deterioration problem of processing accuracy and film quality associated with flowing of the particulates onto the substrate.

SUMMARY OF THE INVENTION

To solve the foregoing problems, the processing method of the particulate dust in plasma of the present invention is one in which the particulate dust in plasma is processed when a substrate to be processed is arranged in a high vacuum enclosure, plasma is generated in the high vacuum enclosure, and a reactive material is appropriately introduced into the high vacuum enclosure to perform processing of the substrate to be processed, wherein at least one collecting electrode is provided around the substrate to be processed in the high vacuum enclosure other than an electrode performing the generation of plasma, and a predetermined electric potential of direct current or alternating current is appropriately applied to the collecting electrode.

With this characteristic, the particulates generated in plasma and negatively electrified are controlled by the collecting electrode and efficiently trapped and collected by appropriately applying the predetermined electric potential of direct current or alternating current to the collecting electrode, and thus the problem of deposition onto the inner wall of the vacuum enclosure and the deterioration problem of processing accuracy and film quality associated with flowing of the particulates onto the substrate can be solved.

The processing apparatus of the particulate dust in plasma of the present invention is one in which the particulate dust in plasma is processed when a substrate to be processed is arranged in the high vacuum enclosure, plasma is generated in the high vacuum enclosure, and a reactive material is appropriately introduced into the high vacuum enclosure to perform processing of the substrate to be processed, which consists of: at least one collecting electrode provided around the substrate to be processed in the high vacuum enclosure other than the electrode performing the generation of plasma; and electrifying means capable of appropriately applying a predetermined electric potential of direct current or alternating current to the collecting electrode.

With this characteristic, the particulates generated in plasma and negatively electrified are efficiently trapped and collected to be removed from plasma by the collecting electrode by appropriately applying the predetermined electric potential of direct current or alternating current to the collecting electrode by the electrifying means, and thus the problem of deposition onto the inner wall of the vacuum enclosure and the deterioration problem of processing accuracy and film quality associated with flowing of the particulates onto the substrate can be solved.

In the processing apparatus of the particulate dust in plasma of the present invention, it is preferable that the collecting electrode has a structure that includes: a storage space for storing the particulates collected therein; and an opening communicating between the storage space and the inside of the high vacuum enclosure.

With this structure, the particulates generated in the plasma is absorbed and stored in the storage space through the opening, more particulates can be stored, and thus not only a life of the collecting electrode is lengthened but also the particulates due to the peeling are prevented from scattering from the opening even if the deposit is peeled in the storage space. Accordingly, the particulates associated with the peeling are made to occur less often.

In the processing apparatus of the particulate dust in plasma of the present invention, it is preferable that a particulate drawing electrode is provided around the opening, which is insulated from the collecting electrode and capable of appropriately applying an electric potential higher than that of the collecting electrode.

Accordingly, since a particulate drawing electrode is provided, the generated particulates that is negatively electrified can be efficiently drawn out from plasma and the amount of the particulates absorbed into the storage space from the opening can be increased.

In the processing apparatus of the particulate dust in plasma of the present invention, it is preferable that the collecting electrode is in a continuous or discontinuous ring shape surrounding the substrate to be processed.

Accordingly, since the collecting electrode is in the continuous or discontinuous ring shape and arranged substantially parallel with a processing plane of the substrate to be processed, a distance between the particulates, which is residual in the plasma boundary region immediately above the processing plane, and the collecting electrode can be made short, and thus the generated particulates can be efficiently collected and removed.

In the processing apparatus of the particulate dust in plasma of the present invention, it is preferable that the opening is provided in an inner periphery of the ring-shaped collecting electrode.

Accordingly, since the particulates drawn to the collecting electrode are absorbed into the storage space from the opening without changing their direction much, the particulates can be absorbed from the opening efficiently.

In the processing apparatus of the particulate dust in plasma of the present invention, it is preferable that the collecting electrode is arranged at a position having substantially the same height as that of the substrate to be processed, and that the opening is formed on an upper surface of the collecting electrode.

Accordingly, since the collecting electrode is arranged at the position having substantially the same height as that of the substrate to be processed, influence of the collecting electrode to plasma due to electrification can be reduced, and in addition, since the particulates drawn to the collecting electrode by forming the opening on an upper surface of the collecting electrode, are absorbed into the storage space from the opening without changing their direction much, the particulates can be absorbed from the opening efficiently.

It is preferable that the processing apparatus of the particulate dust in plasma of the present invention comprises collecting electrode moving means for holding the collecting electrode in a movable manner in the high vacuum enclosure.

Accordingly, even if a continuance position of the generated particulates is changed due to a state of plasma, a type of the reactive material to be introduced or the like, the particulates can be efficiently collected and removed by appropriately moving an orientation and a position of the collecting electrode in accordance with the change.

It is preferable that the processing apparatus of the particulate dust in plasma of the present invention comprises exhaust means for exhausting gas and the particulates in the storage space to the outside of the high vacuum enclosure.

Accordingly, the generated particulates can be efficiently drawn out from plasma by adding an absorbing power by the exhaust means to the absorbing power by the electric charge, and the particulates deposited in the storage space is exhausted by the exhaust means. Therefore, not only a usable period of the collecting electrode can be lengthened, but also the particulates caused by the peeling are further prevented from returning into the high vacuum enclosure.

In the processing apparatus of the particulate dust in plasma of the present invention, it is preferable that the collecting electrode is freely detachable.

Accordingly, replacement of the collecting electrode can be easily executed.

BEST MODE FOR CARRYING OUT THE INVENTION

Preferred embodiments of the present invention will be described with reference to the drawings as follows.

Embodiment 1

Figure 1:
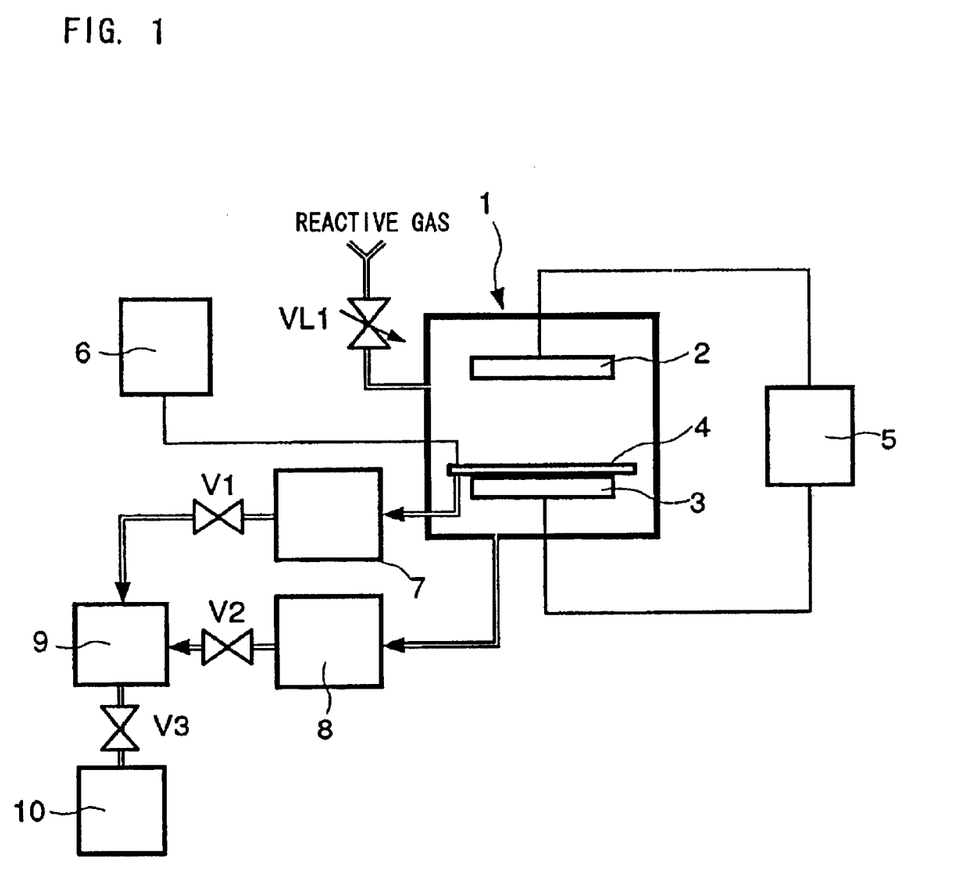
FIG. 1 is a block diagram showing a constitution of a plasma etching unit provided with the processing apparatus of the particulate dust in plasma in a first embodiment of the present invention.

FIG. 1 is the block diagram showing the constitution of the plasma etching unit provided with the processing apparatus of the particulate dust in plasma of the first embodiment. In the plasma etching unit used in the first embodiment, a vacuum enclosure 1 in which an upper electrode 2 of a disk shape for generating plasma and a lower electrode 3 on which a silicon wafer 11 being an object to be processed is mounted are arranged so as to oppose with each other, a first molecular pump 8 to make the inside of the vacuum enclosure be ultrahigh vacuum, and a rotary pump 10 are connected in series, and a trap 9 is provided in the upstream of the rotary pump 10.

Further, variable leak valves VL1 capable of appropriately adjusting an introduction amount of the reactive gas (fluorine, chlorine or the like is mainly used) for etching the silicon wafer 11 are provided to the vacuum enclosure. Adjusting the VL1s makes it possible to appropriately adjust pressure division of the reactive gas introduced into the vacuum enclosure 1, and pressure of the introduced reactive gas is detected by a pressure meter (not shown).

The upper electrode 2 and the lower electrode 3 are connected to a plasma controller 5 as shown in FIG. 1, and an appropriate voltage (about 300 V to 500 V in Embodiment 1) is applied between the electrodes so that the plasma controller 5 generates plasma between the upper electrode 2 and the lower electrode 3 in a good condition.

Figure 2:
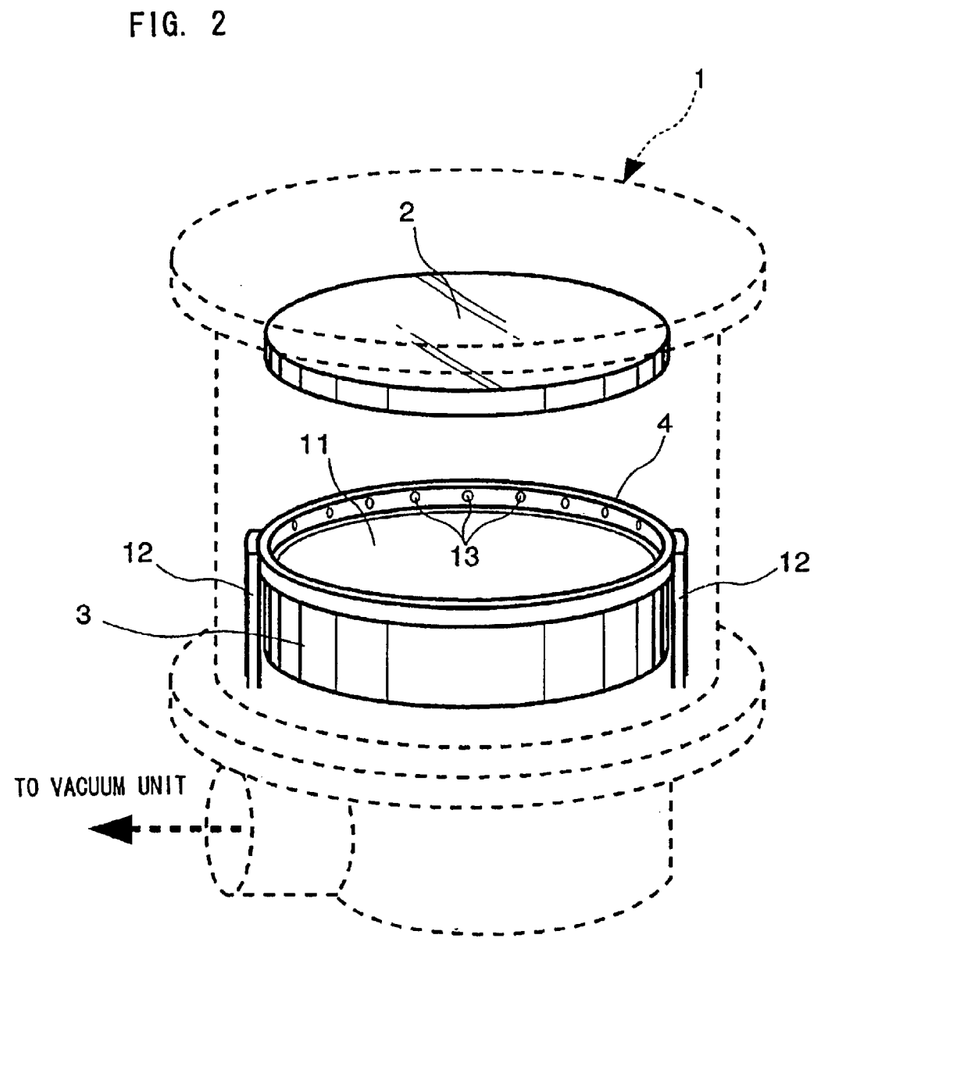
FIG. 2 is a view showing the vacuum enclosure and its inner structure used in the first embodiment of the present invention.

The vacuum enclosure 1 of Embodiment 1 is made of stainless steel or aluminum excellent in anticorrosiveness having a shape shown in FIG. 2, and around the lower electrode 3 on which the silicon wafer 11 being the object to be processed is mounted, a metal collecting electrode 4 that has a continuous ring shape surrounding the silicon wafer 11 mounted on an upper plane of the lower electrode 3 and that collects the particulates generated in plasma is provided on attaching stays 12 inside of which is hollow. The collecting electrode 4 is connected to the rotary pump 10 via the attaching stays 12, a second turbo molecular pump 7 and the trap 9, and the inside of the collecting electrode 4 is absorbed in high vacuum by the second turbo molecular pump 7 via the attaching stays 12. The collecting electrode 4 is also connected to a collecting electrode electrifying unit 6 as the electrifying means for applying a direct voltage so as to appropriately adjust its electric potential (the direct current is used in this embodiment, but the alternating current may also be used).

Figure 3:
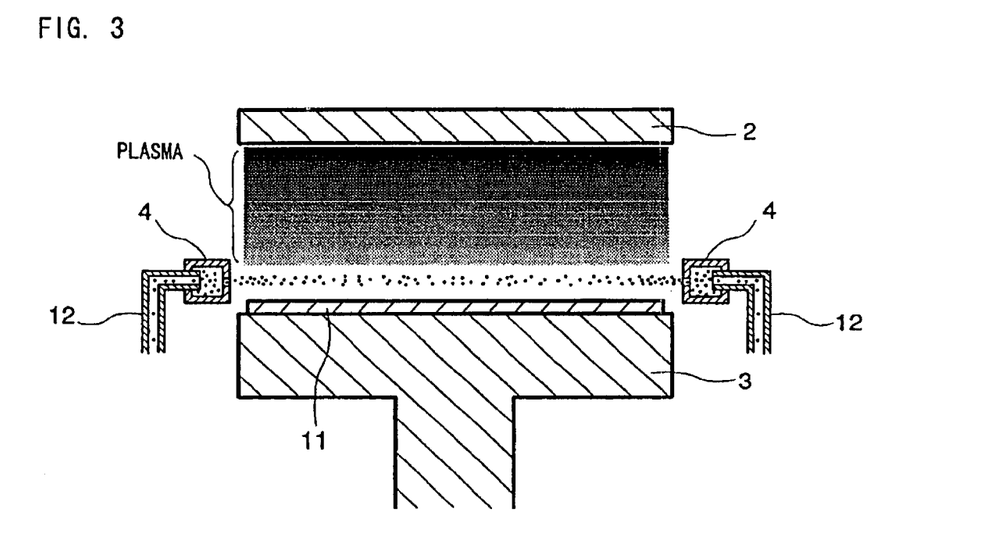
FIG. 3 is a side sectional view showing a removing state of the particulate dust inside the vacuum enclosure used in the first embodiment of the present invention.
Figure 4:
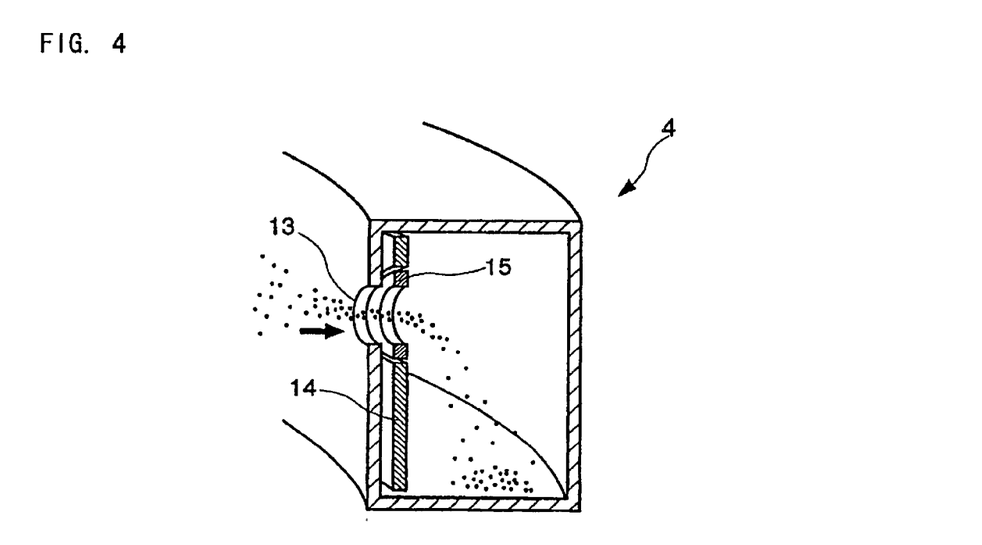
FIG. 4 is a perspective sectional view showing the structure of the collecting electrode used in the first embodiment of the present invention.

The structure of the collecting electrode 4 having the continuous ring shape used in Embodiment 1 is a hollow structure that includes the space capable of storing the collected particulates inside thereof as shown in FIG. 3 and FIG. 4. Openings 13 are formed on the inner periphery of the collecting electrode 4 with a predetermined distance, and the particulates generated in plasma are collected into hollow space of the collecting electrode 4 through the openings 13 and the most of the collected particulates are ejected to the outside of the vacuum enclosure 1 through the attaching stays 12.

As described, although Embodiment 1 uses one collecting electrode 4 of the ring shape, the present invention is not limited to this, and the collecting electrode 4 is made to be plural numbers and the plurality of collecting electrodes may be arranged in a discontinuous ring shape to form the electrode.

Furthermore, in Embodiment 1, particulate drawing electrodes 15 are provided on an inner surface of the inner periphery of the collecting electrode 4 where the openings 13 are formed in order to take in the particulates generated in plasma efficiently into the collecting electrode 4 through the openings 13, the particulate drawing electrode 15 being insulated from the collecting electrode 4 by arranging an electrically insulative insulation plate 14 and formed behind the opening 13 so as to surround the opening 13. The collecting electrode electrifying unit 6 is designed to apply the direct voltage to the particulate drawing electrodes 15 independently of the collecting electrode 4 such that the electric potential of the particulate drawing electrode 15 is appropriately higher than that of the collecting electrode 4.

As described, when the particulate drawing electrodes 15 is provided to keep the electric potential thereof appropriately higher than that of the collecting electrode 4, the particulates generated in plasma and electrified in negative charge can be efficiently drawn out from plasma and the particulates drawn out from plasma are accelerated to be taken into the openings 13, and thus the amount of the particulates taken into the collecting electrode 4 can be increased. Although this is preferable, the present invention is not limited to this, and the particulate drawing electrodes 15 may not be provided.

Further, although a shape of the openings 13 is made to be a circle in Embodiment 1, the present invention is not limited to this, and the openings may be formed in an ellipse or a slit shape and their size also may be selected based on the size of the collecting electrode 4.

Moreover, in Embodiment 1, the particulates collected inside the collecting electrode 4 are ejected to the outside of the vacuum enclosure 1 through the attaching stays 12. Although this ejection method is preferable because deposition of the particulates in the hollow of the collecting electrode 4 is reduced and the usable period of the collecting electrode 4 can be lengthened, the present invention is not limited to this.

Description will be made for an operation of the processing apparatus of the particulate dust in plasma of Embodiment 1 as follows. Firstly, the plasma controller 5 applies the predetermined electric potential between the upper electrode 2 and the lower electrode 3 to generate plasma inside the vacuum enclosure 1 where the reactive gas having a predetermined pressure is introduced as in the foregoing.

The reactive gas is excited by radical atoms with full reactivity due to generation of plasma, silicon atoms react with the radical atoms by impacting the radical atoms to the surface of the silicon wafer 11, and fly into the vapor phase in a form of compounds. Thus, the surface of the silicon wafer 11 is etched.

The particulate dust such as the clusters and the like having a size of nano-meter to a few tens of micrometer is generated due to reaction among compounds generated in the etching process again in plasma.

When the electric potential of the collecting electrode 4 is kept lower than the electrical potential of plasma, the generated particulates are electrically confined by the collecting electrode 4 of the ring shape in a radius direction thereof and also confined in the boundary region between plasma and the silicon wafer 11, and taken into the collecting electrode 4 via the openings 13.

At this point, when the electric potential of the particulate drawing electrode 15 is kept higher than the electric potential of the collecting electrode 4, the negatively electrified particulates in plasma are drawn and accelerated by the particulate drawing electrode 15, and taken into the collecting electrode. The particulates taken into the collecting electrode 4 are neutralized in the space inside the collecting electrode 4, a portion of the particulates is stored in the space and the other particulates are ejected to the outside of the vacuum enclosure 1 through the attaching stays 12 as described above.

Figure 5:
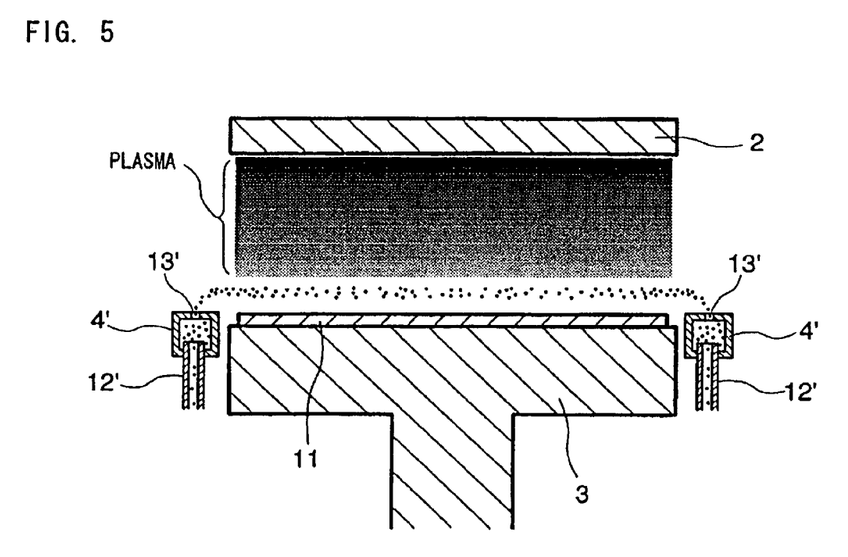
FIG. 5 is a side sectional view showing the removing state of the particulate dust in another embodiment of the present invention.
Figure 6:
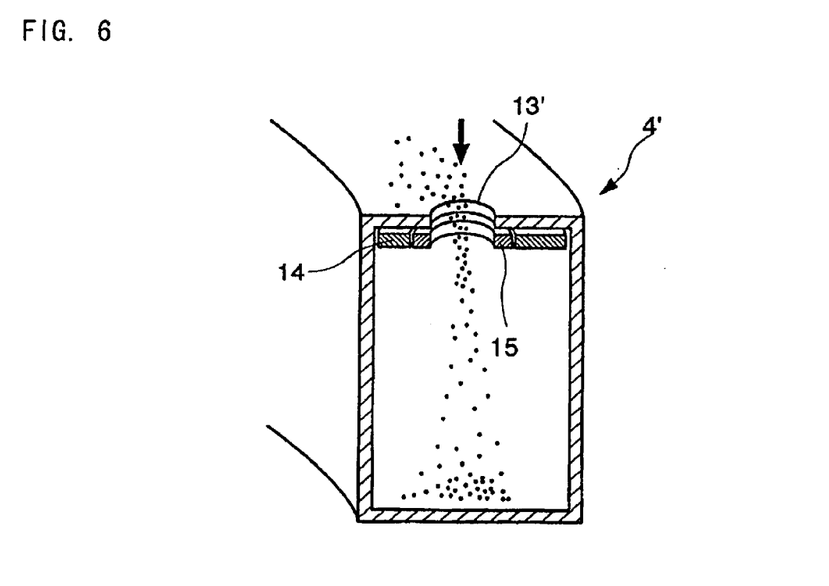
FIG. 6 is a perspective sectional view showing a structure of the collecting electrode in another embodiment of the present invention.

Furthermore, in Embodiment 1, a configuration of the collecting electrode 4 is arranged so as to position higher than the surface height position of the silicon wafer 11 as in FIG. 3, but the present invention is not limited to this. The configuration is made such that a collecting electrode 4' and the surface height position of the silicon wafer 11 are arranged to have substantially the same height positions as shown in FIG. 5, and openings 13' are formed on an upper plane of the collecting electrode 4' accordingly as shown in FIG. 6.

The collecting electrode 4' does not hinder the silicon wafer 11 from being carried in and out onto/from the lower electrode by making the height positions of the collecting electrode 4' and the surface height position of the silicon wafer 11 substantially the same. This not only improves operation efficiency but also can prevent the collecting electrode 4' from influencing generation of plasma. Although this is preferable, the present invention is not limited to this.

When the collecting electrode 4' is used, the electric potential of the collecting electrode 4' is set to a level a little higher (5% to 25%, for example) than that of the lower electrode 3, and thus the negatively electrified particulates are absorbed and removed via the openings 13'.

The collecting electrodes 4 and 4' are periodically detached from the attaching stays 12 for replacement after usage of a predetermined period, and the particulates stored in the inner space of the collecting electrodes 4 and 4' are gathered.

Embodiment 2

Figure 7:
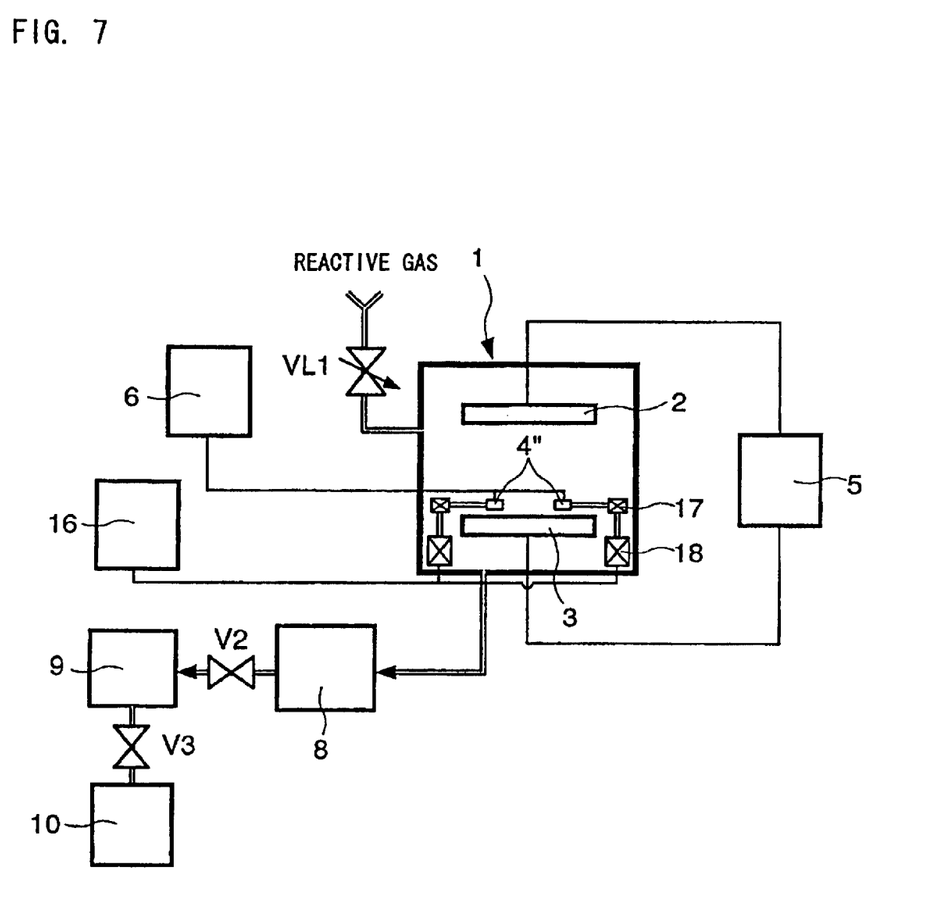
FIG. 7 is a block diagram showing a constitution of the plasma etching unit provided with the processing apparatus of the particulate dust in plasma in a second embodiment of the present invention.

FIG. 7 is the block diagram showing the constitution of the plasma etching unit provided with the processing apparatus of the particulate dust in plasma of the second embodiment, its main constitution is substantially the same as Embodiment 1, and the same reference numerals are used for the items same as Embodiment 1.

Figure 9:
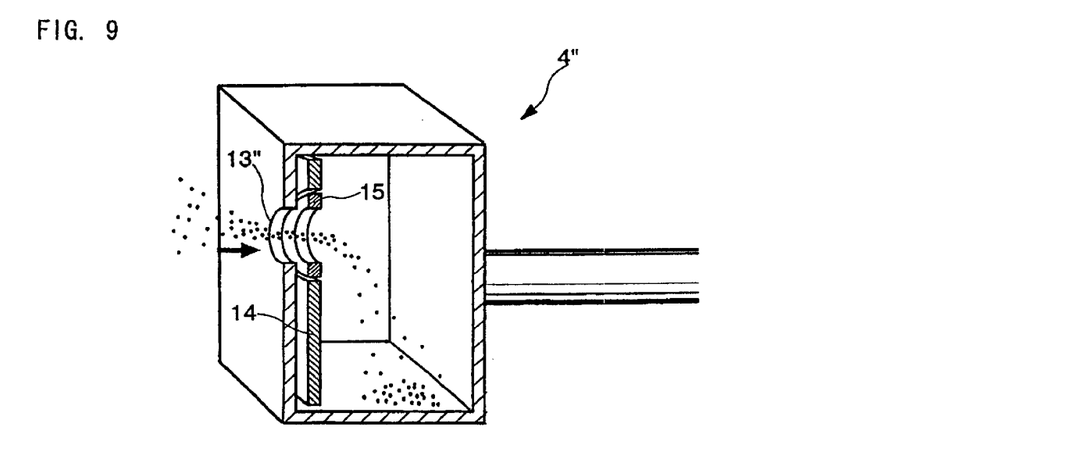
FIG. 9 is a perspective sectional view showing the structure of the collecting electrode used in the second embodiment of the present invention.

In Embodiment 2, what is significantly different from Embodiment 1 is that a collecting electrode 4" used in Embodiment 2 is a box shape of a predetermined size as shown in FIG. 9 relative to the ring shape in Embodiment 1. An opening 13" is formed on a side of the electrode, each collecting electrode 4" is connected to the collecting electrode electrifying unit 6 similarly to Embodiment 1, and the particulate drawing electrode 15 is fit in behind the opening 13". Note that the collecting electrode 4" is the box shape in Embodiment, but the present invention is not limited to this and the shape of the collecting electrode is arbitrarily decided.

Figure 8:
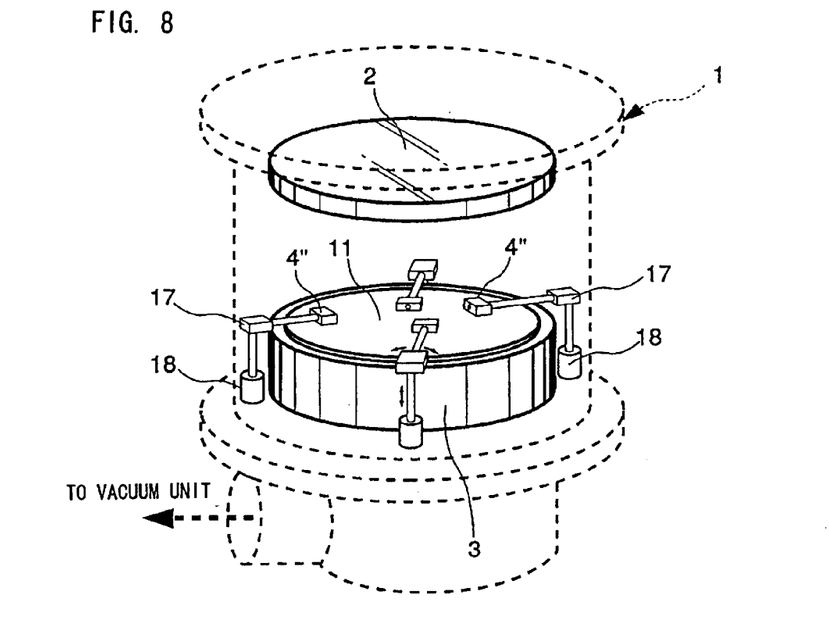
FIG. 8 is a view showing the vacuum enclosure and its inner structure used in the second embodiment of the present invention.

The collecting electrode 4", as shown in FIG. 7 and FIG. 8, is attached to a tip end of a movable arm as collecting electrode moving means that consists of an elevating unit 18 and a rotating unit 17, and the movable arms to which the collecting electrode 4" is attached are provided from peripheral four directions toward a central region of the lower electrode 3.

The elevating unit 18 and the rotating unit 17 are connected to a movable arm controller 16 that controls the movement of the movable arm. The elevating unit 18 moves an arm section attached thereto up and down and the rotating unit 17 executes rotation of the arm section attached thereto based on an instruction from the movable arm controller 16. Thus, each collecting electrode 4" can individually move above the silicon wafer 11.

When the collecting electrodes 4" are appropriately moved to gather the generated particulates in plasma into the collecting electrodes 4", the electric potential of the collecting electrodes 4" may be set to a level a little higher than that of the lower electrode 3.

Accordingly, moving the collecting electrodes 4" is preferable, because even if a generation position of the particulates generated is changed depending on a status of plasma or a type of the reactive gas used, the particulates can be efficiently removed by moving the collecting electrodes 4" in accordance with the positional change. Moreover, in Embodiment 2, although the collecting electrode used is the box shaped collecting electrode 4", the present invention is not limited to this and the collecting electrodes 4 and 4' of the ring shape may be appropriately moved.

Further, although it is not executed in Embodiment 2, a function that the orientation of the opening 13" can be changed to up, down, right or left is optional.

As in the foregoing, the present invention has been described based on the drawings. It is needless to say that the present invention is not limited to the embodiments, but changes and additions without departing from the spirit of the present invention are included in the present invention.

For example, description is made for the plasma etching apparatus in the embodiments, but the present invention is not limited to this, and it is needless to say that the present invention is applicable to any apparatus such as a film manufacturing apparatus using the plasma process.

Furthermore, functions such that a heater or the like is provided for the collecting electrodes 4 and 4' to heat them if necessary in order to prevent adhesion of the particulates, removal of the particulates deposited is executed periodically and the like are optional.

The silicon wafer is used as the substrate to be processed in each embodiment, but the present invention is not limited to this, and the substrate to be processed is arbitrarily decided.

In addition, the shapes, the configurations and the like of the insulation plate 14 and the particulate drawing electrode 15 are also not limited to each embodiment, but the shapes, the configurations and the like may be appropriately changed.

Still further, the openings 13, 13' and 13" are provided in each embodiment, but the present invention is not limited to this. The particulate dust generated in plasma may be trapped into predetermined space or deposited on the collecting electrodes 4, 4' and 4" during the plasma processing by appropriately controlling the electrical potential of the collecting electrodes 4, 4' and 4" instead of providing the openings 13, 13' and 13".

What is claimed is:

1. A plasma processing apparatus in which particulate dust is generated when a substrate is processed by plasma in a high vacuum enclosure, and a reactive material is introduced into the high vacuum enclosure, the apparatus comprising:

a plasma generating electrode and at least one particulate collecting electrode, wherein the said at least one collecting electrode has a storage space for storing particulates collected therein, said collecting electrode further having openings communicating between the storage space and an inside of the high vacuum enclosure, said collecting electrode being provided adjacent the substrate been processed;

an electric potential source for applying an electric potential of direct current or alternating current to the collecting electrode; and at least one particulate drawing electrode, which is insulated from said collecting electrode, for applying an electric potential higher than the electric potential of said collecting electrode, provided around said openings of said collecting electrode.

2. The processing apparatus according to claim 1, wherein said collecting electrode is in a continuous or discontinuous ring shape and surrounds the substrate being processed.

3. The processing apparatus according to claim 1, wherein said openings are provided on an inner periphery of said collecting electrode.

4. The processing apparatus according to claim 1, wherein said collecting electrode is arranged at a position having substantially the same height as the height of the substrate being processed, and said openings are formed on an upper surface of the collecting electrode.

5. The processing apparatus according to claim 1, and further comprising a support mechanism for supporting and moving said collecting electrode relative to said substrate being processed in said high vacuum enclosure.

6. The processing apparatus according to claim 1, and further comprising an exhaust mechanism for exhausting gas and particulates in said storage space to an outside of the high vacuum enclosure.

7. The processing apparatus according to claim 1, wherein said collecting electrode is freely detachable.

* * * * *